United States Patent
Nam et al.

(10) Patent No.: US 11,698,406 B2
(45) Date of Patent: Jul. 11, 2023

(54) CIRCUIT FOR TESTING MONITORING CIRCUIT AND OPERATING METHOD THEREOF

(71) Applicant: SAMSUNG ELECTRONICS CO., LTD., Suwon-si (KR)

(72) Inventors: Hyunseok Nam, Yongin-si (KR); Sangyoung Lee, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 431 days.

(21) Appl. No.: 16/925,389

(22) Filed: Jul. 10, 2020

(65) Prior Publication Data

US 2021/0172999 A1  Jun. 10, 2021

(30) Foreign Application Priority Data

Dec. 9, 2019 (KR) .................. 10-2019-0162913

(51) Int. Cl.
*G01R 31/28* (2006.01)
*G01R 31/3167* (2006.01)

(52) U.S. Cl.
CPC ..... *G01R 31/2829* (2013.01); *G01R 31/3167* (2013.01); *G01R 31/2856* (2013.01)

(58) Field of Classification Search
CPC ........ G01R 31/318505; G01R 31/2829; G01R 31/2856
See application file for complete search history.

(56) References Cited

U.S. PATENT DOCUMENTS

| | | | |
|---|---|---|---|
| 6,807,225 B1 * | 10/2004 | Tonietto | H03L 7/104 327/48 |
| 7,302,600 B2 | 11/2007 | Bibikar et al. | |
| 7,327,153 B2 | 2/2008 | Weinraub | |
| 7,675,281 B1 | 3/2010 | Holt et al. | |
| 8,283,933 B2 | 10/2012 | Dasnurkar | |
| 8,970,408 B2 | 3/2015 | Bogner et al. | |
| 9,257,905 B1 | 2/2016 | Kotikalapoodi | |
| 9,300,212 B2 | 3/2016 | Notman | |
| 2009/0112555 A1 * | 4/2009 | Boerstler | G01R 31/31727 703/14 |
| 2010/0060078 A1 | 3/2010 | Shaw | |
| 2011/0279723 A1 * | 11/2011 | Takamiya | H03M 1/0612 348/308 |
| 2014/0084884 A1 * | 3/2014 | Lee | H02M 3/157 323/271 |
| 2016/0124478 A1 | 5/2016 | Beeston et al. | |
| 2017/0115717 A1 | 4/2017 | Shankar et al. | |
| 2017/0118012 A1 * | 4/2017 | Pernull | H04L 9/0662 |
| 2019/0072589 A1 * | 3/2019 | Loh | G01R 19/155 |

* cited by examiner

*Primary Examiner* — Jermele M Hollington
*Assistant Examiner* — Temilade S Rhodes-Vivour
(74) *Attorney, Agent, or Firm* — Fish & Richardson P.C.

(57) ABSTRACT

A test circuit for testing a monitoring circuit includes: a ramp generator configured to generate a ramp signal in response to an activated first control signal; a counter configured to count pulses of a clock signal in response to the activated first control signal; at least one register configured to store an output value of the counter based on a change in at least one output signal generated by the monitoring circuit in response to the ramp signal in a test mode; and a controller configured to generate the first control signal and verify the monitoring circuit based on a ratio of a value stored in the at least one register to a duration during which the first control signal is activated.

20 Claims, 22 Drawing Sheets

CIRCUIT FOR TESTING MONITORING CIRCUIT AND OPERATING METHOD THEREOF

CROSS-REFERENCE TO RELATED APPLICATION

This application claims the benefit of Korean Patent Application No. 10-2019-0162913, filed on Dec. 9, 2019 in the Korean Intellectual Property Office, the subject matter of which is hereby incorporated by reference.

BACKGROUND

The inventive concept relates to test circuits, and more particularly, test circuits that verify the operation of a monitoring circuit. The inventive concept also relates to methods of testing a monitoring circuit.

Monitoring circuits may be used to detect abnormal operation of components in an electrical system. For example, because serious problems may arise if electrical components operate abnormally in a vehicle. Hence, a monitoring circuit is often used to detect any abnormal operation of the electrical components. As the number of electrical components increases and the number of functions performed by the electrical components is increases, however, the number of monitoring circuits required to detect abnormal operation increases dramatically.

Given the importance of the monitoring circuit, a test circuit for testing the monitoring circuit may be used. For example, the test circuit may test the monitoring circuit while the monitoring circuit stops monitoring the operations of the electrical components. Due to high accuracy of the monitoring circuit, the test circuit may also be required to have high accuracy. Due to the increased number of monitoring circuits, the test circuit may be required to have high efficiency, for example, a small area and low power consumption.

SUMMARY

The inventive concept provides a circuit for testing a monitoring circuit with high accuracy and high efficiency and an operating method thereof.

According to an aspect of the inventive concept, there is provided a test circuit for testing a monitoring circuit, including: a ramp generator configured to generate a ramp signal in response to an activated first control signal, a counter configured to count pulses of a clock signal in response to the activated first control signal, at least one register configured to store an output value of the counter based on change in an output signal generated by the monitoring circuit in response to the ramp signal, and a controller configured to generate the first control signal, wherein the monitoring circuit is set to a test mode in response to an activated first control signal, and the controller is further configured to verify the operation of the monitoring circuit based on a ratio of at least one value stored in the at least one register, wherein the at least one value is obtained during the test mode.

According to an aspect of the inventive concept, there is provided a system including; a main circuit configured to perform at least one function and generate an object signal, a monitoring circuit configured to monitor the object signal during a normal mode and monitor a ramp signal during a test mode, and a test circuit configured as a built-in, self-test for the monitoring circuit, and further configured to generate the ramp signal and test the monitoring circuit based on a ratio between a first period during which the ramp signal is generated, and a second period determined by a change in an output signal of the monitoring circuit in response to the ramp signal.

According to an aspect of the inventive concept, there is provided a method of testing a monitoring circuit. The method includes; generating a ramp signal, counting pulses of a clock signal while the ramp signal is generated, storing a first count value based on a first period determined by a change in an output signal of the monitoring circuit, and verifying the monitoring circuit based on a ratio of the first count value and a second count value based on a second period determined by the generating of the ramp signal.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
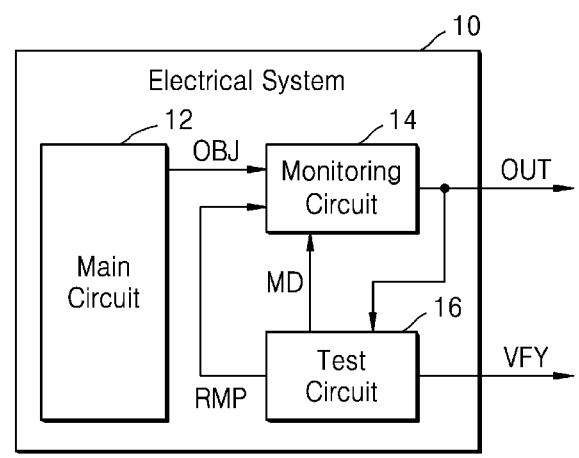
FIG. 1 is a block diagram illustrating an electrical system according to an embodiment of the inventive concept.

FIG. 1 is a block diagram illustrating an electrical system 10 according to an embodiment of the inventive concept.

The electrical system 10 may be any apparatus configured to perform one or more function(s) using electrical energy. For example, the electrical system 10 may be a semiconductor chip, a module including at least one semiconductor chip, or a system including two or more modules that communicate with each other. The electrical system 10 may be a unit capable of independent use (e.g., a mobile phone), a unit (or functional component) configured for operation within a system (e.g., a vehicle), or a constituent (or entire) system (e.g., a System-on-Chip). As illustrated in FIG. 1, the electrical system 10 may generally include, possibly among many other elements, a main circuit 12, a monitoring circuit 14, and a test circuit 16.

The main circuit 12 may be designed to perform one or more function(s) associated with the electrical system 10. That is, the main circuit 12 may actually perform the one or more function(s) or perform a function that is, in an of itself, a basis for one or more function(s) performed by the electrical system 10. For example, the main circuit 12 may include one or more analog circuit(s) (e.g., a voltage generator, an analog filter, an amplifier, etc.), one or more digital circuit(s), and/or one or more mixed signal circuit(s) (e.g., an analog-to-digital converter (ADC), a digital-to-analog converter (DAC), etc.). Hereinafter, a voltage generator will principally be referred to as one example of the main circuit 12, but it will be understood that embodiments of the inventive concept are not limited thereto.

It is possible for a myriad of reasons (e.g., manufacturing defects, aging wear and tear, mechanical shock, harsh operating conditions, etc.) that the main circuit 12 may fail to properly perform an intended function (hereafter, generally, "operates abnormally"). When the main circuit 12 operate abnormally, the electrical system 10 and/or a system incorporating the electrical system 10 may operationally fail.

For example, the electrical system 10 may be included in a vehicle and may be intended to perform one or more critical function(s) necessary to the safe driving (e.g., autonomous driving) of the vehicle. Hence, any abnormal operation of the electrical system 10 may cause serious problems. In order to safeguard against an abnormal operation of the main circuit 12 and/or the electrical system 10 in certain applications, various international standards have been defined and are widely available (e.g., on the Internet). For example, one standard referred to as ISO26262 has been defined by the International Standard Organization (ISO) and relates to the operation and functional safety of vehicles. In this regard, ISO26262 defines various requirements for functional safety associated with electrical and/or electronic (E/E) systems in vehicles. In one particular aspect, ISO26262 requires the essential inclusion of a component capable of continuously monitoring the functional operation of the main circuit 12.

As generally expressed in FIG. 1, the monitoring circuit 14 may be used to monitor the main circuit 12. For example, the monitoring circuit 14 may monitor the operation of the main circuit 12 in response to (or based on) an object signal OBJ provided by the main circuit 12. When the main circuit 12 operates abnormally, the monitoring circuit 14 may generate an output signal OUT indicating the abnormal operation of the main circuit 12. The output signal OUT may be provided to component(s) internal to the electrical system 10 (e.g., a system controller 148 of FIG. 14), and/or component(s) external to the electrical system 10. Therefore, whether the main circuit 12 operates abnormally/normally may be determined based on the output signal OUT. When the main circuit 12 operates abnormally, necessary follow-up measures must be appropriately undertaken. In some embodiments, like those described with reference to FIG. 2 hereafter, the monitoring circuit 14 may include one or more comparator(s) configured to determine the state of the object signal OBJ. That is, in certain embodiments of the inventive concept, the monitoring circuit 14 may generate the output signal OUT based on the output of comparator(s). Examples of the monitoring circuit 14 will be described in some additional detail with reference to FIGS. 2 and 12.

International standards, such as ISO26262, may define the essential inclusion of the monitoring circuit 14 for the monitoring of the main circuit 12, as well as certain additional component(s) configured to detecting whether or not the monitoring circuit 14 itself is operating normally. That is, the test circuit 16 (e.g., a built-in, self-test or BIST) may be provided as a further safeguard related to the functional performance of the main circuit 12. For example, should the monitoring circuit 14 operate abnormally, a concurrent abnormal operation by the main circuit 12 could go undetected (a false positive indication). Alternately, a malfunctioning monitoring circuit 14 may erroneously generate the output signal OUT indicating abnormal operation of the main circuit 12 when, in fact, the main circuit 12 is operating normally (a false negative indication). To prevent either of these outcomes, the test circuit 16 may be used to verify the normal operation of the monitoring circuit 14—as the monitoring circuit 14 monitors the performance of the main circuit 12.

In the illustrated example of FIG. 1, the test circuit 16 provides a mode signal MD and a ramp signal RMP to the monitoring circuit 14, and further provides a verify signal VFY indicating the results of verification testing on the monitoring circuit 14 in response to the output signal OUT provided by the monitoring circuit 14. Here, the verify signal VFY may be provided to one or more internal components and/or one or more external components.

In this regard, the monitoring circuit 14 may be configured (or set) to operate in either a "normal mode" during which the monitoring circuit 14 monitors the main circuit 12, or a "test mode" during which the monitoring circuit 14 performs verification testing in conjunction with the test circuit 16. Thus, the monitoring circuit 14 may be configured in response to the mode signal MD to set either the normal mode or test mode of operation. For example, during the normal mode, the monitoring circuit 14 may generate the output signal OUT based on the object signal OBJ received from the main circuit 12. In contrast, during the test mode, the monitoring circuit 14 may generate the output signal OUT based on the ramp signal RMP received from the test circuit 16.

In regular operation, therefore, the test circuit 16 may set the monitoring circuit 14 to the test mode using the mode signal MD in order to run verification testing on the monitoring circuit 14, and once the verification testing is complete, the test circuit 16 may reset the monitoring circuit 14 to the normal mode using the mode signal MD. In some embodiments, as described below with reference to FIG. 3, the mode signal MD may be same as a first control signal CTR1.

The test circuit 16 may generate the ramp signal RMP that gradually increases or decreases in order to test the monitoring circuit 14. As described above, the monitoring circuit 14 may include at least one comparator that determines the state (or adequacy) of the object signal OBJ. In the test mode, the ramp signal RMP may be provided to the at least one comparator included in the monitoring circuit 14. When the monitoring circuit 14 operates normally, the state of the output signal OUT may change at a first time according to a particular magnitude of the ramp signal RMP. Otherwise, the output signal OUT may change at a second time, different from the first time, or it may not change at all over a period of the ramp signal RMP. In some embodiments, the test circuit 16 may determine this "change time", as measured by the change in the output signal OUT in response to the ramp signal RMP. In certain embodiments of the inventive concept, verification testing of the monitoring circuit 14 may include determining a ratio between the change time and an overall test time. Therefore, the monitoring circuit 14 may be accurately tested in spite of possible variations in a clock signal and/or the ramp signal RMP used to determine the change time and/or a total test time, thereby improving the reliability of the electrical system 10.

In some embodiments, the electrical system 10 may include a plurality of monitoring circuits that respectively monitor the main circuit 12 or additional main circuits 12 (not shown in FIG. 1). For example, a DC-DC converter used to generate a supply voltage may require about 10 or more monitoring circuits. Thus, when multiple DC-DC converters are included in the electrical system 10 in order to generate different supply voltages, the total number of monitoring circuits included in the electrical system 10 may become significant. For example, a dramatic increase in the number of monitoring circuits may cause a corresponding increase in the number of required test circuits, and the resulting tangle of many monitoring circuits and test circuits may greatly complicate the design and layout of the electrical system 10 and adversely impact the spatial efficiency of the electrical system 10.

Alternatively, instead of increasing the number of test circuits, two or more monitoring circuits may share a test circuit. However, in this case, additional components may be required to facilitate the connection and operational sharing of the test circuit, and test errors may occur due to extended distancing between the test circuit and the monitoring circuit. In great contrast, embodiments of the inventive concept, like those described in relation to FIGS. 4A and 4B, the test circuit 16 of FIG. 1 may include an analog circuit having a simple structure and configured to generate the ramp signal RMP. Such embodiments allow BIST to be faithfully achieved with reduced overall overhead and complexity.

Figure 2:
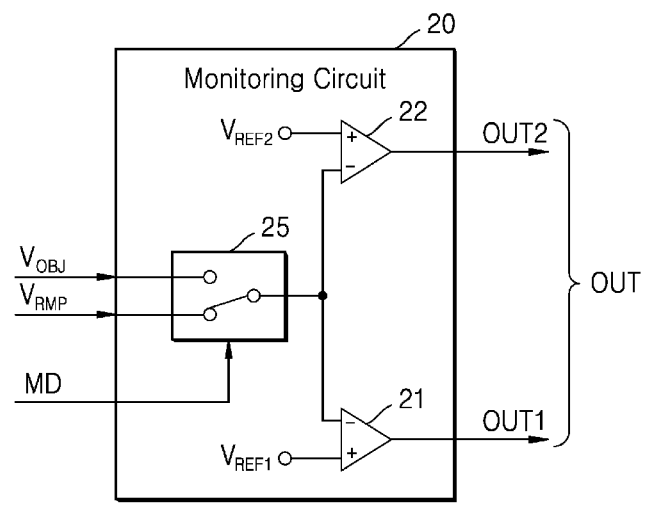
FIG. 2 is a block diagram further illustrating an example of the monitoring circuit 14 of FIG. 1 according to an embodiment of the inventive concept.

FIG. 2 is a block diagram further illustrating an example of the monitoring circuit 14 of FIG. 1 according to an embodiment of the inventive concept. As described above with reference to FIG. 1, the monitoring circuit 20 of FIG. 2 may be configured to monitor the functional performance of the main circuit 12 by determining the state (e.g., a level) of the object signal OBJ. As illustrated in FIG. 2, the monitoring circuit 20 may include a first comparator 21, a second comparator 22, and a switch circuit 25.

Referring to FIGS. 1 and 2, the monitoring circuit 20 may monitor whether the level of the object signal OBJ falls within a specified "normal range." For example, the monitoring circuit 20 may receive the object signal OBJ (e.g., as an object voltage $V_{OBJ}$) and the ramp signal RMP (e.g., as a ramp voltage $V_{RMP}$). The normal range of the object voltage $V_{OBJ}$ may be defined by a second reference voltage $V_{REF2}$ that is different from (e.g., greater than) a first reference voltages $V_{REF1}$ (e.g., $V_{REF2}>V_{REF1}$), such that the monitoring circuit 20 may detect whether the object voltage $V_{OBJ}$ falls between the first reference voltage $V_{REF1}$ and the second reference voltage $V_{REF2}$. To this end, the monitoring circuit 20 may include a first comparator 21 that receives the first reference voltage $V_{REF1}$ and a second comparator 22 that receives the second reference voltage $V_{REF2}$. The monitoring circuit 20 may generate an output signal OUT as a first output signal OUT1 provided by the first comparator 21 and a second output signal OUT2 provided by the second comparator 22. Here, the first reference voltage $V_{REF1}$ may be referred to as a "lower limit" of the object voltage $V_{OBJ}$, and the second reference voltage $V_{REF2}$ may be referred to as an "upper limit" of the object voltage $V_{OBJ}$.

The switch circuit 25 may be used to provide either the object voltage $V_{OBJ}$ or the ramp voltage $V_{RMP}$ to the first and second comparators 21 and 22 in response to the mode signal MD provided by the test circuit 16. For example, the switch circuit 25 may provide the object voltage $V_{OBJ}$ to the first and second comparators 21 and 22 when the mode signal MD indicates the normal mode, and the ramp voltage $V_{RMP}$ to the first and second comparators 21 and 22 when the mode signal MD indicates the test mode. Therefore, as described below with reference to FIG. 5, in the test mode, the first and second comparators 21 and 22 may generate the first and second output signals OUT1 and OUT2, which respective change at first and second times at which the ramp voltage $V_{RMP}$ respectively crosses the first and second reference voltages $V_{REF1}$ and $V_{REF2}$. In the following description, and as illustrated in FIG. 2, it is assumed that the object signal OBJ and the ramp signal RMP of FIG. 1 are the object voltage $V_{OBJ}$ and the ramp voltage $V_{RMP}$, respectively, and, therefore, that the monitoring circuit 14 includes the voltage comparator. However, it should be noted that the monitoring circuit 14 may perform monitoring using other types of signals (e.g., current signals). In some embodiments, the switch circuit 25 may include at least one transistor controlled by the mode signal MD.

Figure 3:
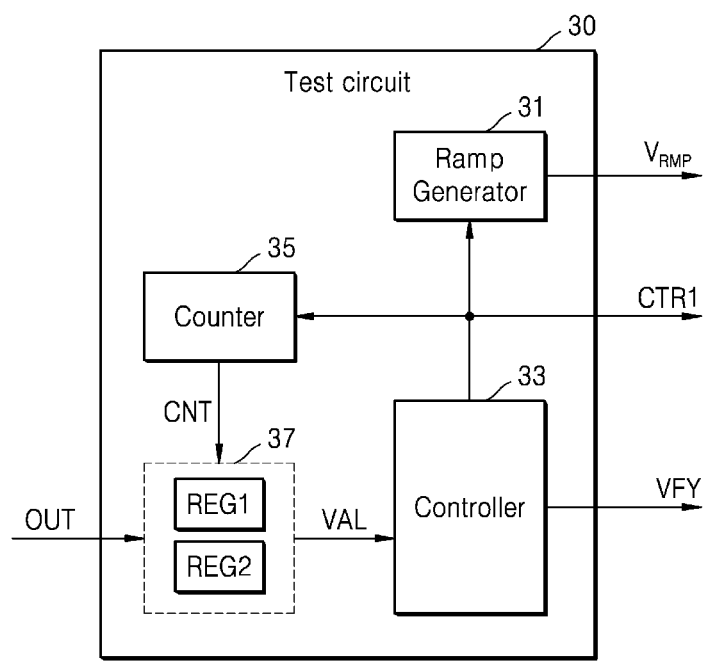
FIG. 3 is a block diagram illustrating an example of the test circuit 30 according to an embodiment of the inventive concept.

FIG. 3 is a block diagram further illustrating an example of the test circuit 16 of FIG. 1 according to an embodiment of the inventive concept. Referring to FIGS. 1, 2 and 3, the test circuit 30 may receive the output signal OUT and generate the ramp signal RMP and the verify signal VFY. In addition, the test circuit 30 may be used to generate a first control signal CTR1. The first control signal CTRL1 may be used as the mode signal MD previously described in relation to FIGS. 1 and 2, or as a separate control signal in addition to the mode signal MD. In the illustrated example of FIG. 3, the test circuit 30 includes a ramp generator 31, a controller 33, a counter 35, and a register set 37.

In the description that follows, control signals like the mode signal MD and the first control signal CTR1 are assumed to be active high signals. Therefore, an activated control signals has a high level and a inactivated control signal has a low level.

The ramp generator 31 may generate a ramp voltage $V_{RMP}$ in response to an activated first control signal CTR1. For example, the ramp generator 31 may generate the ramp voltage $V_{RMP}$ that gradually increases over a period beginning from when the first control signal CTR1 is activated (e.g., the period between time t11 and time t18 shown in FIG. 5). The ramp generator 31 may generate the ramp voltage $V_{RMP}$ capable of crossing both the lower limit (e.g., the first reference voltage $V_{REF1}$) and the upper limit (e.g., the second reference voltage $V_{REF2}$). In some embodiments, the period during which the first control signal CTR1 is activated may be the same as a period during which the monitoring circuit 20 is set to the test mode. This period may be referred to as a test period (PER0). As described hereafter with reference to FIGS. 4A and 4B, the ramp generator 31 may generate the ramp voltage $V_{RMP}$ using a simple circuit structure instead of a more complicated structure like a DAC.

The counter 35 may generate a count signal CNT by counting pulses of a clock signal in response to the activated first control signal CTR1. Thus, the count signal CNT may be referred to as an output of the counter 35, and a value indicated by the count signal CNT may be referred to as an output value or a "count value" of the counter 35. Here, the counter 35 may be reset in response to the inactivated first control signal CTR1 (e.g., CNT=0) and may start counting at a time at which the first control signal CTR1 is activated. As illustrated in FIG. 3, the count signal CNT may be provided to the register set 37. In some embodiments, the counter 35 may include a number of logic gates.

In the illustrated example of FIG. 3, the register set 37 includes at least one register, receives the output signal OUT and the count signal CNT, and provides at least one value VAL stored in the register set 37 to the controller 33. For example, the register set 37 may include first and second registers REG1 and REG2. Values stored in the first and second registers REG1 and REG2 may be provided to the controller 33. The register set 37 may store a count value for the count signal CNT in response to the output signal OUT. For example, as described above with reference to FIG. 2, the output signal OUT may change when the ramp voltage $V_{RMP}$ crosses the lower limit (i.e., $V_{REF1}$) and/or the upper limit (i.e., $V_{REF2}$). That is, the first register REG1 may store the a first count value when the output signal OUT changes in relation to the crossing of the lower limit, and the second register REG2 may store a second value when the output signal OUT changes in relation to the crossing of the upper limit. Therefore, as described below with reference to FIG. 5, the controller 33 may recognize, according to one value VAL, a time period extending from a time at which the generation of the ramp voltage $V_{RMP}$ begins (e.g., the time at which the first control signal CTR1 is activated), to a time at which the ramp voltage $V_{RMP}$ crosses the lower limit. The controller 33 may further recognize, according to another value VAL, a time period extending from a time at which the generation of the ramp voltage $V_{RMP}$ begins (e.g., the time at which the first control signal CTR1 is activated), to a time at which the ramp voltage $V_{RMP}$ crosses the upper limit.

In other embodiments, instead of the register set 37 directly receiving the output signal OUT, the controller 33 may receive the output signal OUT and the register set 37 may store the value of the count signal CNT under the control of the controller 33.

The controller 33 may obtain at least one value VAL from the register set 37 and may generate the first control signal CTR1 and the verify signal VFY. The controller 33 may set the monitoring circuit 20 to the test mode by generating the activated first control signal CTR1 and may set the monitoring circuit 20 to the normal mode by generating the inactivated first control signal CTR1. The controller 33 may determine whether the monitoring circuit 20 operates normally based on at least one value VAL obtained during the test mode, and may generate the verify signal VFY according to determination. For example, in some embodiments, the controller 33 may determine whether the monitoring circuit 20 operates normally, based on a ratio between a value VAL associated with a duration during which the first control signal CTR1 is activated.

In some embodiments, the controller 33 may include a state machine including a plurality of logic gates and may also include a processor and a memory that stores instructions to be executed by the processor.

Figure 4A:
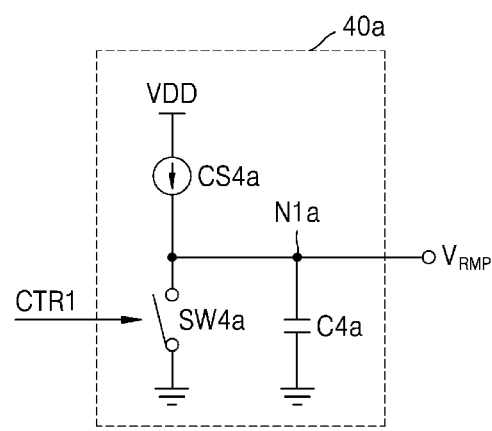
FIGS. 4A and 4B are respective circuit diagrams illustrating examples of the a ramp generator according to an embodiment of the inventive concept.
Figure 4B:
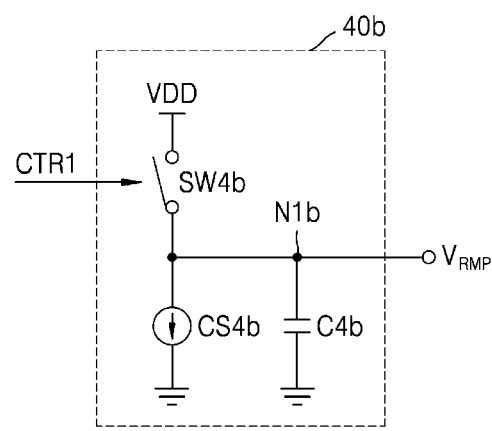

FIGS. 4A and 4B are circuit diagrams respectively illustrating examples of ramp generators 40a and 40b according to embodiments of the inventive concept. That is, FIG. 4A is a circuit diagram illustrating the ramp generator 40a that generates a gradually increasing ramp voltage $V_{RMP}$, and FIG. 4B is the circuit diagram illustrating the ramp generator 40b that generates a gradually decreasing ramp voltage $V_{RMP}$.

Referring to FIG. 4A, the ramp generator 40a may include a current source CS4a, a switch SW4a, and a capacitor C4a. The current source CS4a may provide a constant current from a positive supply voltage VDD to a first node N1a. The switch SW4a and the capacitor C4a may be connected in parallel between the first node N1a and a ground node. The switch SW4a may be turned on or off according to the first control signal CTR1. In some embodiments, the switch SW4a may include a transistor that is controlled by the first control signal CTR1. For example, the switch SW4a may be turned off in response to the activated first control signal CTR1 and may be turned on in response to the inactivated first control signal CTR1. Therefore, the current provided by the current source CS4a in the normal mode may flow through the switch SW4a to the ground node, and the voltage of the first node N1a, that is, the ramp voltage $V_{RMP}$, may be approximately same with the ground potential. The current provided by the current source CS4a in the test mode may be provided to the capacitor C4a. As the capacitor C4a is charged, the ramp voltage $V_{RMP}$ may gradually increase from the ground potential. In the test mode, the slope of the ramp voltage $V_{RMP}$ may depend on the current provided by the current source CS4a and the capacitance of the capacitor C4a.

Referring to FIG. 4B, the ramp generator 40b may include a current source CS4b, a switch SW4b, and a capacitor C4b. The current source CS4b and the capacitor C4b may be connected in parallel between a first node N1b and a ground node. The current source CS4b may drain a constant current from the first node N1b to the ground node. The switch SW4b may selectively apply a positive supply voltage VDD to the first node N1b according to the first control signal CTR1. For example, the switch SW4b may be turned off in response to the activated first control signal CTR1 and may be turned on in response to the inactivated first control signal CTR1. Therefore, in the normal mode, the current source CS4b may drain a current from the positive supply voltage VDD, and the voltage of the first node N1b, that is, the ramp voltage $V_{RMP}$, may be approximately same with the positive supply voltage VDD. In the test mode, the current source CS4b may drain a current from the capacitor C4b. As the capacitor C4b is discharged, the ramp voltage $V_{RMP}$ p may gradually decrease from the positive supply voltage VDD. In the test mode, the slope of the ramp voltage $V_{RMP}$ may depend on the current drained by the current source CS4b and the capacitance of the capacitor C4b.

As described above with reference to FIGS. 4A and 4B, the ramp generators 40a and 40b have relatively simple structures and may, therefore, occupy a relatively small area. Also, the first control signal CTR1 provided so as to generate the ramp voltage $V_{RMP}$ may be a single-bit signal. Therefore, signal routing between the ramp generators 40a and 40b and the controller 33 of FIG. 3 may be minimal. Accordingly, the ramp generator 40a or 40b and the test circuit 30 including the same may be implemented in a small area, and the overhead associated with BIST may be significantly reduced.

In the description that follows, it is assumed that the ramp generator generates the gradually increasing ramp voltage $V_{RMP}$ like the ramp generator 40a of FIG. 4A.

Figure 5:
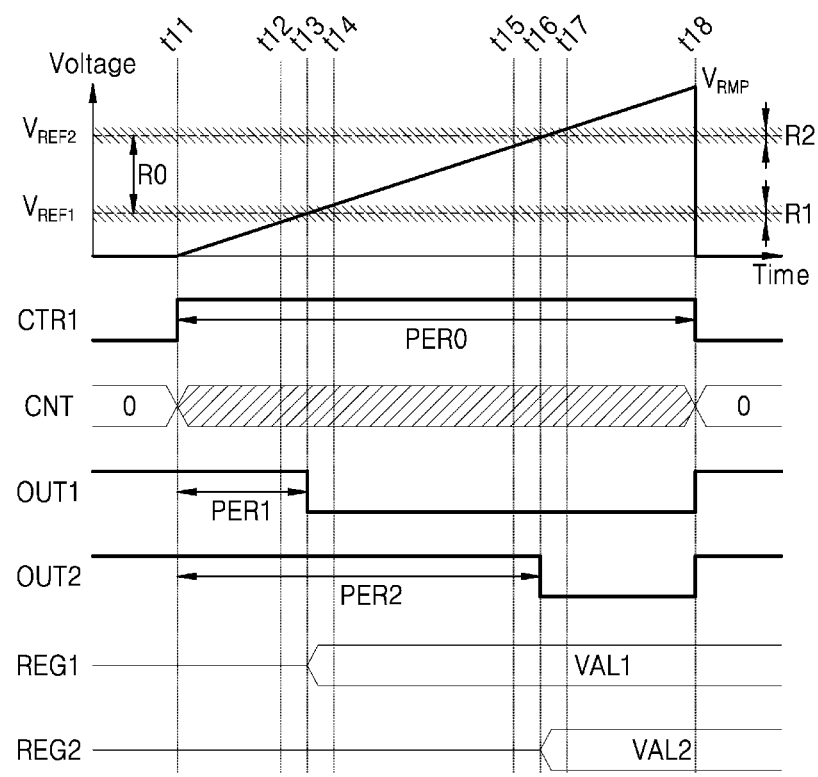
FIG. 5 is a timing diagram illustrating an example of an operation of a test circuit according to an embodiment of the inventive concept.

FIG. 5 is a timing diagram illustrating example signal relationships during operation of the test circuit 30 of FIG. 3 used to test the monitoring circuit 20 of FIG. 2 according to an embodiment of the inventive concept.

Referring to FIGS. 2, 3 and 5, the object voltage $V_{OBJ}$ may be required to fall within a range 'R0' between the first reference voltage $V_{REF1}$ and the second reference voltage $V_{REF2}$. In order to monitor the object voltage $V_{OBJ}$, the monitoring circuit 20 may use the first reference voltage $V_{REF1}$ (which may be defined according to a lower limit range R1) to set a lower limit, and may use the second reference voltage $V_{REF2}$ (which may be defined by an upper limit range R2) to set an upper limit. Accordingly, the test circuit 30 may test the monitoring circuit 20 by determining whether the object voltage $V_{OBJ}$ crosses (or exceeds) the first reference voltage $V_{REF1}$ (i.e., the lower limit range R1 and/or the second reference voltages $V_{REF2}$ (i.e., the upper limit range R2).

For example, at time t11, the controller 33 may activate the first control signal CTR1. Therefore, the ramp generator 31 begins generating the gradually increasing ramp voltage $V_{RMP}$ and the counter 35 starts counting. So long as the ramp voltage $V_{RMP}$ falls to cross (or exceed) the first reference voltage $V_{REF1}$ (i.e., the lower limit range R1), both the first and second output signals OUT1 and OUT2 of the first and second comparators 21 and 22 remain activated.

However, when the ramp voltage $V_{RMP}$ exceeds the first reference voltage $V_{REF1}$, the first output signal OUT1 is inactivated and the first register REG1 stores a first value VAL1 as the value of the count signal CNT. In certain embodiments of the inventive concept like the one illustrated in FIG. 5, the ramp signal $V_{RMP}$ "exceeds" (or "crosses) the first reference voltage $V_{REF1}$ in a gradual manner in relation to a defined limit range, rather than a discrete manner. Thus, at time t12 the ramp signal $V_{RMP}$ enters the lower limit range R. At time t13, the ramp signal $V_{RMP}$ equals the first reference voltage $V_{REF1}$, and at time t14 the ramp signal $V_{RMP}$ exits the lower limit range R1.

When the ramp voltage $V_{RMP}$ crosses the first reference voltage $V_{REF1}$ at time t13, the first output signal OUT1 may be inactivated and the first register REG1 may store a first value VAL1 as the value of the count signal CNT.

In a similar manner, the ramp voltage $V_{RMP}$ may enter the upper limit range R2 at time t15, cross the second reference voltage $V_{REF2}$ at time t16, and exit the upper limit range R2 at time t17. When the ramp voltage $V_{RMP}$ crosses the second reference voltage VREG2 at time t16, the second output signal OUT2 may be inactivated and the second register REG2 may store a second value VAL2 as the value of the count signal CNT.

Assuming that the counter 35 is an up-counter, the second value VAL2 will be greater than the first value VAL1 (i.e., VAL2>VAL1).

At time t18, the controller 33 may inactivate the first control signal CTR1. In some embodiments, the controller 33 may receive the count signal CNT from the counter 35 and inactivate the first control signal CTR1 based on a value of the count signal CNT. In some embodiments, the controller 33 may inactivate the first control signal CTR1 based on a change in the first output signal OUT1 and/or the second output signal OUT2 after the first control signal CTR1 is activated. Due to the inactivated first control signal CTR1, the ramp generator 31 may stop generating the gradually increasing ramp voltage $V_{RMP}$ and the counter 35 may stop counting and be reset. In some embodiments, the counter 35 may maintain the value of the count signal CNT at time t18.

The controller 33 may estimate the duration of a first period PER1 based on the first value VAL1 stored in the first register REG1, and may estimate the duration of the second period PER2 based on the second value VAL2 stored in the second register REG2. Thus, if the first reference voltage $V_{REF1}$ is defined according to the lower limit range R1, the duration of the first period PER1 will also be defined according to the lower limit range R. Similarly, when the second reference voltage $V_{REF2}$ is defined according to the upper limit range R2, the duration of the second period PER2 will also be defined according to the upper limit range R2. The controller 33 may determine whether the first reference voltage $V_{REF1}$ belongs to the lower limit range R1 based on a ratio of the first period PER1 to the test period PER0. For example, the controller 33 may verify the operation of the monitoring circuit 20 based on the lower limit range R1 using the following Equation 1:

$$REF1 - \alpha < \frac{PER1}{PER0} < REF1 + \alpha \quad \text{[Equation 1]}$$

Here, PER1 and PER0 indicate the duration of the first period PER1 and the duration of the test period PER0, respectively. The first reference value REF and a positive margin 'a' may be predefined based on the lower limit range R. Similarly, the controller 33 may determine whether the second reference voltage $V_{REF2}$ belongs to the upper limit range R2 based on a ratio of the second period PER2 to the test period PER0. For example, the controller 33 may verify the operation of the monitoring circuit 20 based on the upper limit range using the following Equation 2:

$$REF2 - \beta < \frac{PER2}{PER0} < REF2 + \beta \quad \text{[Equation 2]}$$

Here, PER2 indicates the duration of the second period PER2, and a second reference value REF2 and a positive margin 'β' may be predefined based on the upper limit range R2. When both Equation 1 and Equation 2 are satisfied, the controller 33 may determine that the monitoring circuit 20 is operating normally, and may generate a verify signal VFY accordingly. In some embodiments, a in Equation 1 and β in [Equation 2] may be same with each other. Also, in some embodiments, the controller 33 may include a memory (e.g., non-volatile memory such as flash memory) that stores the first reference values REF and α from Equation 1 as well as second reference values REF2 and β from Equation 2, or may access the memory, and may update at least one of the first reference value REF1, the second reference value REF2, α, and β stored in the memory in response to an external signal.

Figure 6:
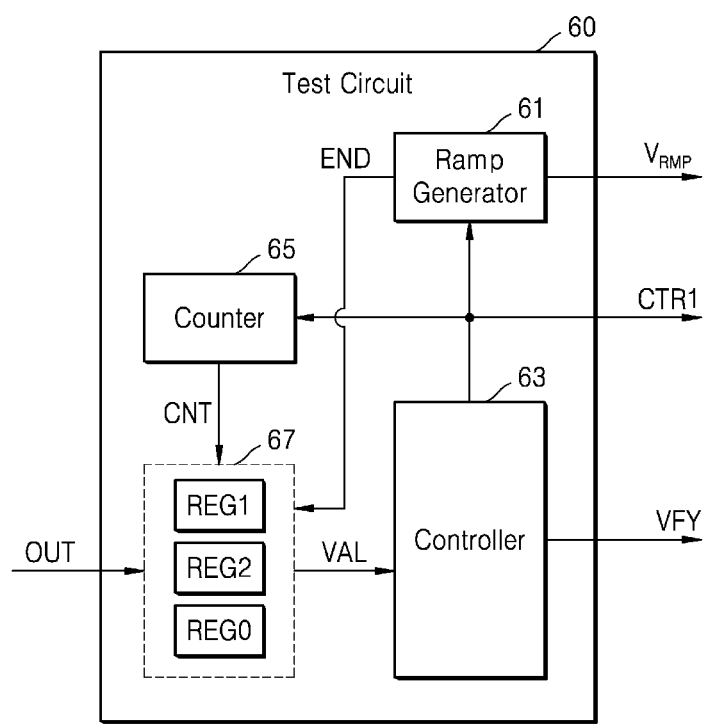
FIG. 6 is a block diagram further illustrating an example of a test circuit according to an embodiment of the inventive concept.

FIG. 6 is a block diagram further illustrating another example of the test circuit 16 of FIG. 1 according to an embodiment of the inventive concept. That is, the block diagram of FIG. 6 illustrates a test circuit 60 including a controller 63 that receives an end signal END from a ramp generator 61. Similar to the test circuit 30 of FIG. 3, the test circuit 60 may include the ramp generator 61, the controller 63, a counter 65, and a register set 67.

Referring to FIGS. 1, 3, 5 and 6 the ramp generator 61 may generate the end signal END in response to the ramp voltage $V_{RMP}$. In some embodiments, the ramp generator 61 may generate the activated end signal END when the ramp voltage $V_{RMP}$ generated to increase gradually in response to an activated first control signal CTR1 reaches a predefined upper level. In this case, the upper level may be higher than the upper limit range R2 and the second reference voltage $V_{REF2}$. Therefore, when the end signal END is activated, the ramp voltage $V_{RMP}$ may have been crossed with both the first reference voltage $V_{REF1}$ and the second reference voltage $V_{REF2}$.

Similar to the test circuit 30 of FIG. 3, the register set 67 may include first and second registers REG1 and REG2 and may further include a reference register REG0. The reference register REG0 may store a value of a count signal CNT when a test period is ended. For example, as illustrated in FIG. 6, the register set 67 may receive the end signal END from the ramp generator 61, and the reference register REG0 may store the value of the count signal when the end signal END is activated.

The controller 63 may generate the verify signal VFY based on the values stored in the reference register REG0, as well as the values stored in the first and second registers REG1 and REG2 included in the register set 67. For example, the controller 63 may recognize the duration of the test period PER0 based on the value stored in the reference register REG0 and may verify the operation of the monitoring circuit 20 based (e.g.,) the relationships described by [Equation 1] and [Equation 2]. In some embodiments, the controller 63 may receive the end signal END from the ramp generator 61 and inactivate the first control signal CTR1 in response to the activated end signal END. Also, in some embodiments, instead of the register set 67 directly receiving the end signal END, unlike in FIG. 6, the controller 63 may receive the end signal END and the register set 67 may store the value of the count signal CNT under the control of the controller 63.

Figure 7:
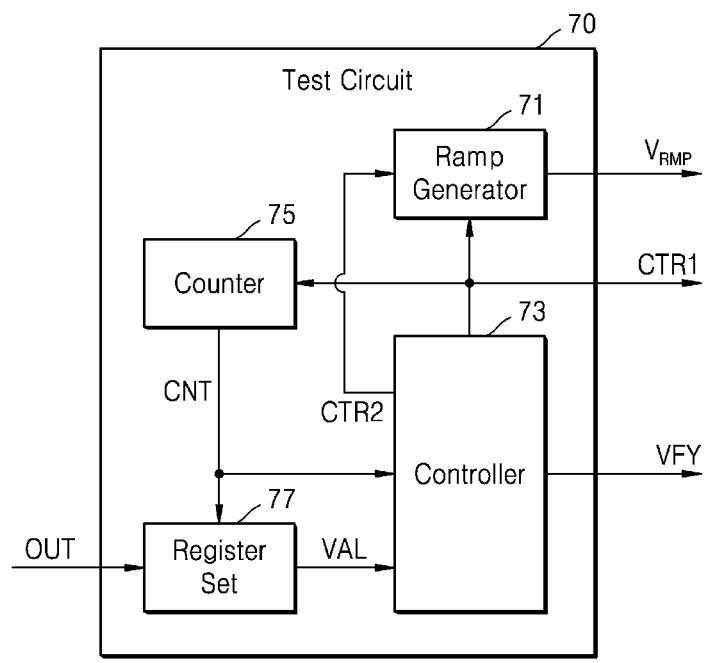
FIG. 7 is a block diagram further illustrating an example of a test circuit according to an embodiment of the inventive concept.
Figure 8:
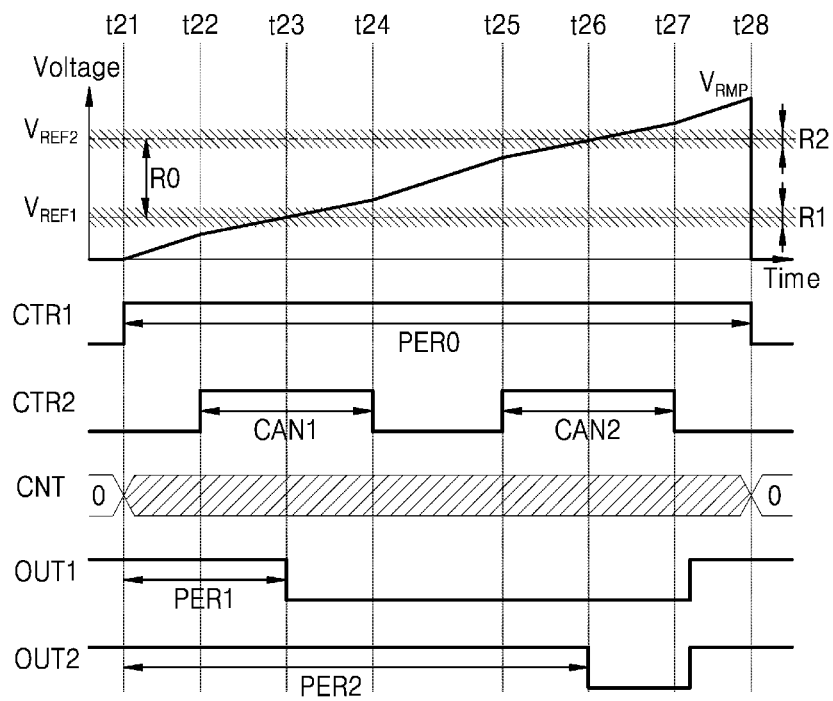
FIGS. 8 and 9 are respective timing diagrams illustrating examples of an operation of a test circuit according to an embodiment of the inventive concept.

FIG. 7 is a block diagram illustrating a test circuit 70 according to an embodiment of the inventive concept, and FIG. 8 is a timing diagram further illustrating the operation of the test circuit 70 according to an embodiment of the inventive concept.

Here, the test circuit 70 may include a controller 73 that further generates a second control signal CTR2 provided to a ramp generator 71. The timing diagram of FIG. 8 illustrates the operation of the test circuit 70 that tests the monitoring circuit 20 of FIG. 2.

Referring to FIGS. 2, 7 and 8 (and similar to the test circuit 30 of FIG. 3), the test circuit 70 may include the ramp generator 71, the controller 73, a counter 75, and a register set 77. The ramp generator 71 may generate a ramp voltage $V_{RMP}$ in response to an activated first control signal CTR1 and may adjust a slope of the ramp voltage $V_{RMP}$ based on the second control signal CTR2. In some embodiments, when the ramp generator 71 includes the same elements as those of the ramp generator 40a of FIG. 4A, the current source CS4a may receive the second control signal CTR2 and may adjust the magnitude of a current provided from the positive supply voltage VDD to the first node N1a based on the second control signal CTR2. Therefore, in the test mode, the slope of the ramp voltage $V_{RMP}$ may decrease when the current provided by the current source CS4a decreases and may increase when the current provided by the current source CS4a increases. Also, in some embodiments, the capacitor C4a may have a variable capacitance according to the second control signal CTR2. In the example of FIG. 8 to be described below, it is assumed that the ramp generator 71 decreases the slope of the ramp voltage $V_{RMP}$ in response to the activated second control signal CTR2.

The controller 73 may adjust testing resolution for the monitoring circuit 20 using the second control signal CTR2. That is, when the slope of the ramp voltage $V_{RMP}$ is relatively small, more clock signal pulses may be generated in a given voltage range. Therefore, relatively high resolution testing may be achieved. However, in order to reduce the time required for the BIST performed by the test circuit 70, the controller 73 may adjust (i.e., decrease) the slope of the ramp voltage $V_{RMP}$ in at least part of the entire test period PER0 (e.g., CAN1 and CAN2 in FIG. 8). As illustrated in FIG. 7, the controller 73 may determine a period in which the slope of the ramp voltage $V_{RMP}$ is adjusted, based on the count signal CNT received from the counter 75.

In some embodiments, the controller 73 may generate the second control signal CTR2 such that the slope of the ramp voltage $V_{RMP}$ decreases in a candidate period (e.g., CAN1 and CAN2 of FIG. 8) including a time at which a change in the first output signal OUT1 and/or the second output signal OUT2 is expected. That is, in order to achieve higher resolution around time(s) at which the ramp voltage $V_{RMP}$ crosses the lower limit or the upper limit, the controller 73 may decrease the slope of the ramp voltage $V_{RMP}$ during candidate period(s). Therefore, the test circuit 70 may perform the verification of the ramp voltage $V_{RMP}$, that is, the test of the monitoring circuit 20, with higher resolution while minimizing an increase in the overall test period.

Referring to FIG. 8, at time t21, the controller 73 may activate the first control signal CTR1. Therefore, the ramp generator 31 may generate the gradually increasing ramp voltage $V_{RMP}$ and the counter 75 may start counting. The controller 73 may generate the inactivated second control signal CTR2, and accordingly, the ramp generator 71 may generate the ramp voltage $V_{RMP}$ increasing at a second slope.

At time t22, the controller 73 may activate the second control signal CTR2. At time t23, the ramp voltage $V_{RMP}$ may cross the lower limit (i.e., the first reference voltage $V_{REF1}$. At time t24, the controller 73 may inactivate the second control signal CTR2. Therefore, the ramp voltage $V_{RMP}$ may increase at a low slope (i.e., the first slope) before crossing the first reference voltage $V_{REF1}$ or before entering the lower limit range R1 and may increase again at an high slope (i.e., the second slope) after crossing the first reference voltage $V_{REF1}$, or after exiting from the lower limit range R. As illustrated in FIG. 8, a period in which the slope of the ramp voltage $V_{RMP}$ decreases corresponding to the first reference voltage $V_{REF1}$ or the lower limit range R1 may be referred to as a first candidate period CAN1. The first period PER1 may end within the first candidate period CAN1.

At time t25, the controller 73 may again activate the second control signal CTR2. At time t26, the ramp voltage $V_{RMP}$ may cross the upper limit (i.e., the second reference voltage $V_{REF2}$). At time t27, the controller 73 may inactivate the second control signal CTR2. Therefore, the ramp voltage $V_{RMP}$ may increase at a low slope before crossing the second reference voltage $V_{REF2}$ or before entering the upper limit range R2 and may increase again at an high slope after crossing the upper limit (i.e., the second reference voltage $V_{REF2}$), or after exiting from the upper limit range R2. As illustrated in FIG. 8, a period in which the slope of the ramp voltage $V_{RMP}$ decreases corresponding to the second reference voltage $V_{REF2}$ or the upper limit range R2 may be referred to as a second candidate period CAN2. The second period PER2 may end within the second candidate period CAN2.

At time t28, the controller 73 may inactivate the first control signal CTR1. Therefore, the ramp generator 71 may stop generating the increasing ramp voltage $V_{RMP}$, and the counter 75 may stop counting. As described above with reference to FIG. 5, the controller 73 may test the monitoring circuit 20 based on a ratio of the first period PER1 to the test period PER0 and a ratio of the second period PER2 to the test period PER0.

Figure 9:
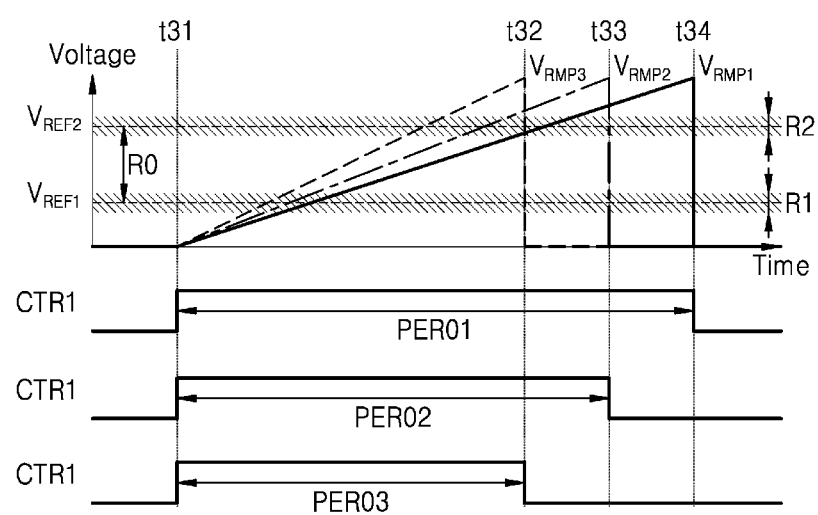

FIG. 9 is a timing diagram illustrating another example of the operation of the test circuit 70 according to an embodiment of the inventive concept. Here, the timing diagram of FIG. 9 illustrates an example of the operation of the test circuit 70 of FIG. 7 that tests the monitoring circuit 20 of FIG. 2.

Referring to FIGS. 2, 7 and 9, the controller 73 may adjust the slope of the ramp voltage $V_{RMP}$ so as to adjust the test period PER0. For example, the controller 73 may obtain information about the time allowed for testing of the monitoring circuit 20 and may determine the test period PER0 based on the information. In some embodiments, the test period PER0 for the monitoring circuit 20 immediately after power is supplied to the test circuit 70 may be relatively long, and the test period PER0 used during the operation of the test circuit 70 (e.g., in an idle period or periodically) may be relatively short. The controller 73 may adjust the slope of the ramp voltage $V_{RMP}$ through the second control signal CTR2 so that the test of the monitoring circuit 20 is completed within the determined test period PER0.

Referring to FIG. 9, as illustrated by a ramp voltage $V_{RMP1}$, when a longest test period PER01 is allowed, the controller 73 may generate the first control signal CTR1 activated between time t31 and time t34 and may generate the second control signal CTR2 corresponding to a lowest slope. Also, as illustrated by the ramp voltage $V_{RMP2}$, when a test period PER02 having an intermediate duration is allowed, the controller 73 may generate the first control signal CTR1 activated between time t31 and time t33, the ramp voltage $V_{RMP2}$ may generate the first control signal CTR1 activated between time t31 and time t33, and the controller 73 may generate the second control signal CTR2 corresponding to an intermediate slope. Also, as illustrated by a ramp voltage $V_{RMP3}$, when a shortest test period PER03 is allowed, the controller 73 may generate the first control signal CTR1 activated between time t31 and time t32 and may generate the second control signal CTR2 corresponding to a highest slope. In some embodiments, unlike in FIG. 9, the ramp generator 71 may support four or more or two or less different slopes of the ramp voltage $V_{RMP}$, and the controller 73 may select the supported slopes of the ramp voltage $V_{RMP}$ through the second control signal CTR2.

Figure 10:
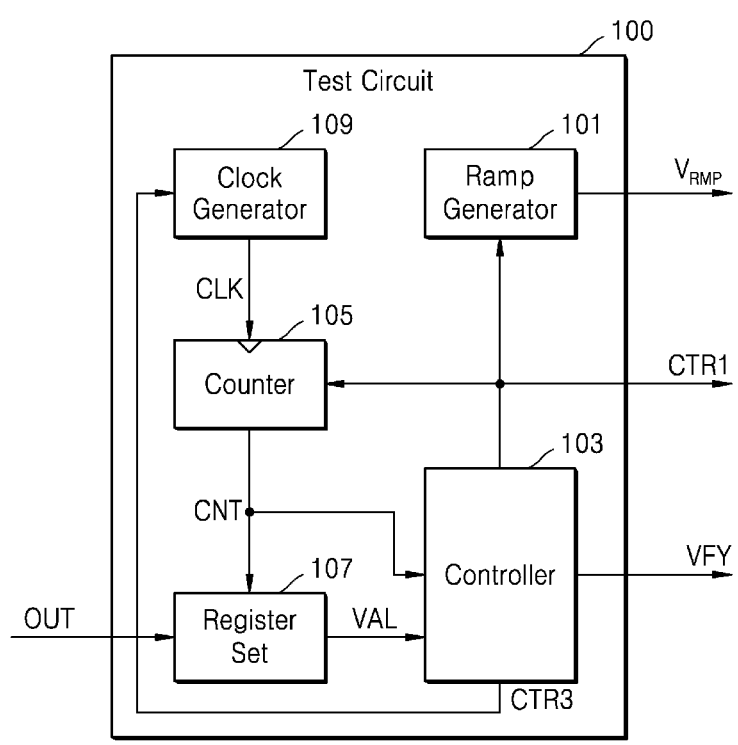
FIG. 10 is a block diagram illustrating an example of a test circuit according to an embodiment of the inventive concept.
Figure 11:
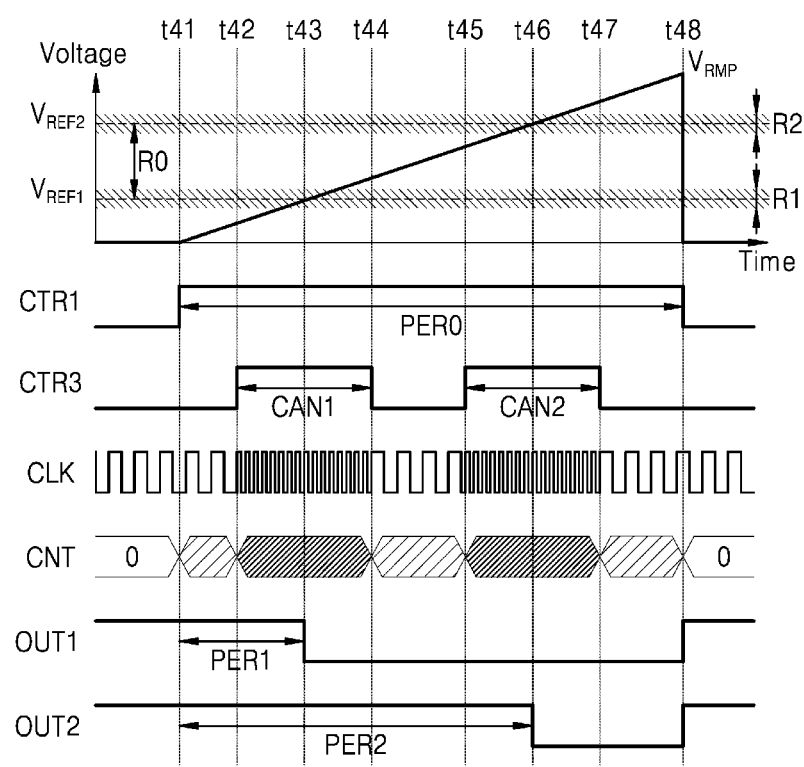
FIG. 11 is a timing diagram illustrating an example of an operation of a test circuit according to an embodiment of the inventive concept.

FIG. 10 is a block diagram illustrating a test circuit 100 according to an embodiment of the inventive concept, and FIG. 11 is a timing diagram illustrating the operation of the test circuit 100 according to an embodiment of the inventive concept. Here, the test circuit 100 may include a controller 103 that controls a clock generator 109.

Referring to FIGS. 2, 10 and 11 (and similar to the test circuit 30 of FIG. 3), the test circuit 100 may include a ramp generator 101, the controller 103, a counter 105, and a register set 107 and may further include the clock generator 109. The clock generator 109 may provide a clock signal CLK to the counter 105, and the counter 105 may count pulses of the clock signal CLK. Although not illustrated in FIG. 3, the test circuit 30 of FIG. 3 may further include a clock generator providing the clock signal CLK to the counter 35. The clock generator 109 may receive a third control signal CTR3 from the controller 103 and may adjust a frequency of the clock signal CLK based on the third control signal CTR3. In some embodiments, the clock generator 109 may receive a first control signal CTR1 and generate the clock signal CLK in response to the activated first control signal CTR1. Hereinafter, in the example of FIG. 11, it is assumed that the clock generator 109 increases the frequency of the clock signal CLK in response to the activated third control signal CTR3.

The controller 103 may adjust the testing resolution for the monitoring circuit 20 through the third control signal CTR3. That is, as a counting speed of the counter 105 increases at a given time, higher resolution may be achieved. However, in order to reduce power consumption caused by clock signal CLK transitions, the controller 73 may adjust (e.g., increase) the frequency of the clock signal CLK during at least part of the entire test period PER0 (e.g., CAN1 and CAN2 in FIG. 11). As illustrated in FIG. 10, the controller 103 may receive a count signal CNT from the counter 105 and may determine a period for adjusting the frequency of the clock signal CLK based on the count signal CNT.

Referring to FIG. 11 (similar to the example of FIG. 8), the controller 103 may generate the third control signal CTR3, so as to increase the frequency of the clock signal CLK, during candidate periods CAN1 and CAN2 that overlap a time at which a change in a first output signal OUT1 and/or a second output signal OUT2 is expected. At time t41, the controller 103 may activate the first control signal CTR1. Therefore, the ramp generator 101 may generate a gradually increasing ramp voltage $V_{RMP}$ and the counter 105 may start counting. The controller 103 may generate the inactivated third control signal CTR3. Therefore, the clock generator 109 may generate the clock signal CLK oscillating at a second frequency.

At time t42, the controller 103 may activate the third control signal CTR3. At time t43, the ramp voltage $V_{RMP}$ may cross a first reference voltage $V_{REF1}$. At time t44, the controller 103 may inactivate the third control signal CTR3 again. Therefore, the clock signal CLK may have an increased frequency (which may be referred to as a first frequency herein) before the ramp voltage $V_{RMP}$ crosses the first reference voltage $V_{REF1}$ or before the ramp voltage $V_{RMP}$ enters the first range R1 and may have a decreased frequency (which may be referred to as a second frequency herein) after the ramp voltage $V_{RMP}$ crosses the first reference voltage $V_{REF1}$ or after the ramp voltage $V_{RMP}$ deviates from the first range R1. That is, the frequency of the clock signal CLK may be increased in the first candidate period CAN1, and the value of the count signal CNT may be increased at a faster rate.

At time t45, the controller 103 may activate the third control signal CTR3. At time t46, the ramp voltage $V_{RMP}$ may cross a second reference voltage $V_{REF2}$. At time t47, the controller 103 may inactivate the third control signal CTR3 again. Therefore, the clock signal CLK may have an increased frequency before the ramp voltage $V_{RMP}$ crosses the second reference voltage $V_{REF2}$ or before the ramp voltage $V_{RMP}$ enters the second range R2 and may have a decreased frequency after the ramp voltage $V_{RMP}$ crosses the second reference voltage $V_{REF2}$ or after the ramp voltage $V_{RMP}$ deviates from the second range R2. That is, the frequency of the clock signal CLK may be increased in the second candidate period CAN2, and the value of the count signal CNT may be increased at a faster rate.

At time t48, the controller 103 may inactivate the first control signal CTR1. Therefore, the ramp generator 101 may stop generating the increasing ramp voltage $V_{RMP}$ and the counter 105 may stop counting. As described above with reference to FIG. 5, the controller 103 may test the monitoring circuit 20 based on a ratio of the first period PER1 to the test period PER0 and a ratio of the second period PER2 to the test period PER0.

Figure 12:
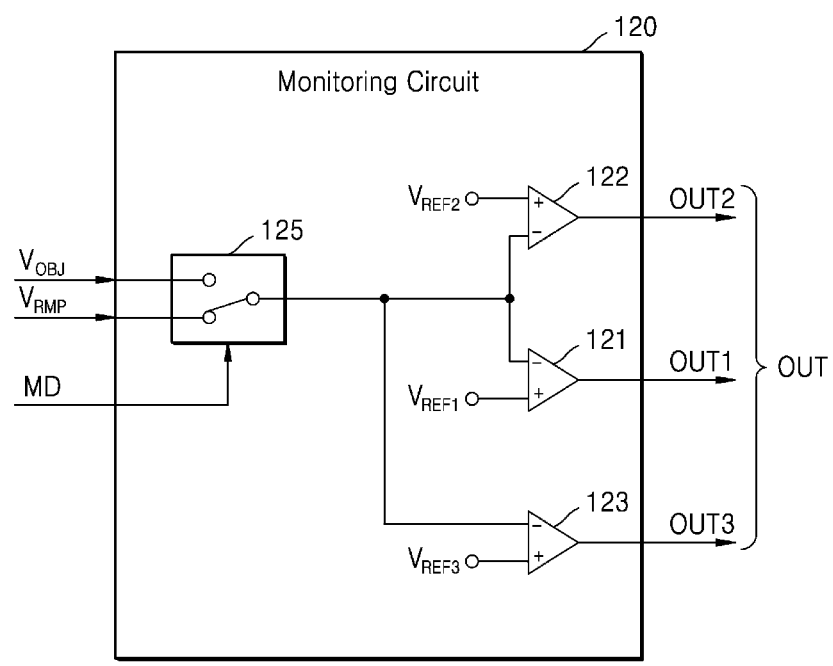
FIG. 12 is a block diagram further illustrating an example of a monitoring circuit according to an embodiment of the inventive concept.
Figure 13:
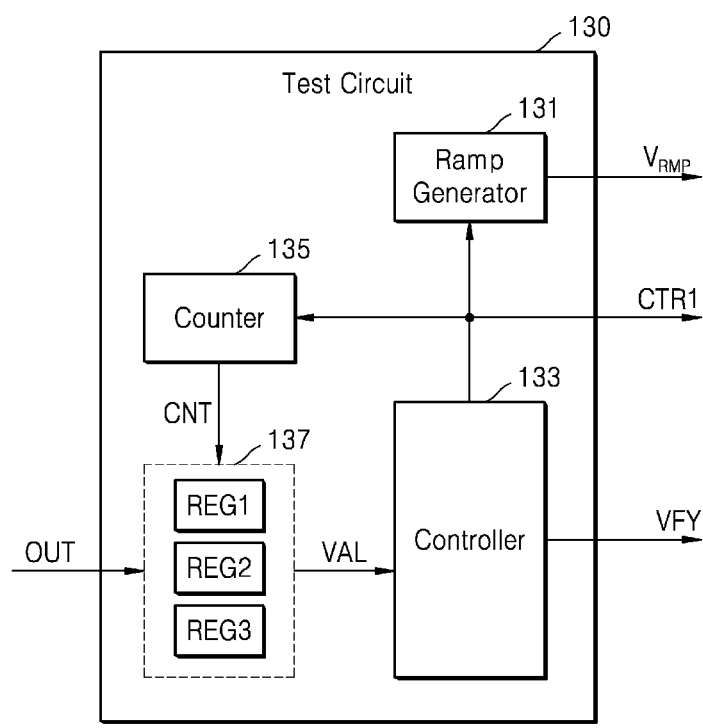
FIG. 13 is a block diagram further illustrating an example of a test circuit according to an embodiment of the inventive concept.

FIG. 12 is a block diagram illustrating an example of a monitoring circuit 120 according to an embodiment of the inventive concept. FIG. 13 is a block diagram illustrating an example of a test circuit 130 according to an embodiment of the inventive concept.

Here, FIG. 12 illustrates the monitoring circuit 120 including multiple comparators (e.g., first, second, and third comparators 121, 122, and 123) and FIG. 13 illustrates the test circuit 130 that tests the monitoring circuit 120.

Referring to FIG. 12 (similar to the monitoring circuit 20 of FIG. 2), the monitoring circuit 120 may include a switch circuit 125 and the first and second comparators 121 and 122 and may further include the third comparator 123. The first and second comparators 121 and 122 may receive first and second reference voltages $V_{REF1}$ and $V_{REF2}$ corresponding to lower and upper limits, respectively. The third comparator 123 may receive a third reference voltage $V_{REF3}$ that is lower than the first reference voltage $V_{REF1}$ corresponding to the lower limit. For example, the main circuit 12 of FIG. 1 may be a DC-DC converter, and the object voltage $V_{OBJ}$ may provide power to electrical components as a supply voltage. Serious problems may be caused when a current path is formed between the object voltage $V_{OW}$ and the ground potential due to a failure of at least one of the electrical components supplied with power from the object voltage $V_{OBJ}$. The monitoring circuit 120 may include the third comparator 123 that receives a third reference voltage $V_{REF3}$ so as to detect a short circuit event and whether the main circuit 12 operates normally. Therefore, when a short circuit event occurs, a third output signal OUT3 included in an output signal OUT may transition to a low level.

Referring to FIG. 13 (similar to the test circuit 30 of FIG. 3), the test circuit 130 may include a ramp generator 131, a controller 133, a counter 135, and a register set 137. Compared with the register set 37 of FIG. 3, the register set 137 of FIG. 13 may further include a third register REG3. The third register REG3 may store the value of the count signal CNT when the output signal OUT corresponding to a short circuit is changed. For example, similar to [Equation 1] and [Equation 2], the controller 133 may verify the operation of the monitoring circuit 20 in relation to a potential short circuit with reference to the following [Equation 3]:

$$REF3 - \gamma < \frac{PER3}{PER0} < REF3 + \gamma \qquad \text{[Equation 3]}$$

In [Equation 3], PER3 indicates the duration of the third period, that is, the period from the start of the test period REG0 to the time at which the ramp voltage $V_{RMP}$ crosses the third reference voltage $V_{REF3}$, and a third reference value REF3 and a positive margin 'y' may be predefined based on an allowable range including the third reference voltage $V_{REF3}$.

Figure 14:
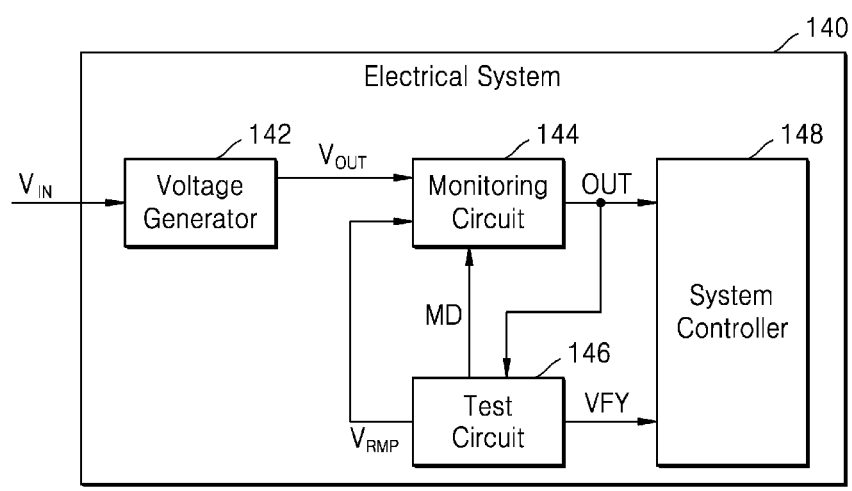
FIG. 14 is a block diagram illustrating an electrical system according to an embodiment of the inventive concept.
Figure 15:
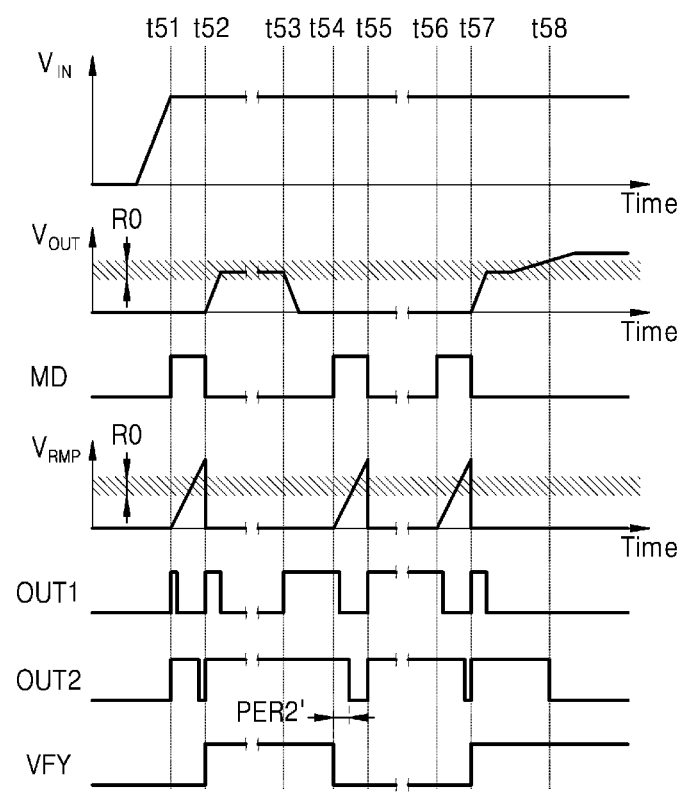
FIG. 15 is a timing diagram illustrating an example of an operation of an electrical system according to an embodiment of the inventive concept.

FIG. 14 is a block diagram illustrating an example of an electrical system 140 according to an embodiment of the inventive concept. FIG. 15 is a timing diagram illustrating an example of the operation of the electrical system 140 according to an embodiment of the inventive concept. Here, the block diagram of FIG. 14 illustrates the electrical system 140 including a voltage generator 142 as a main circuit, and FIG. 15 illustrates an operation of a monitoring circuit 144 for the voltage generator 142 and an operation of a test circuit 146 for the monitoring circuit 144. It is assumed that the monitoring circuit 144 of FIG. 14 has the same structure as that of the monitoring circuit 20 of FIG. 2.

Referring to FIG. 14, the voltage generator 142 may generate an output voltage $V_{OUT}$ from an input voltage $V_{IN}$, where the output voltage $V_{OUT}$ is required to have a particular level. The monitoring circuit 144 may receive the output voltage $V_{OUT}$ from the voltage generator 142 and may receive the ramp voltage $V_{RMP}$ and the mode signal MD from the test circuit 146. In some embodiments (similar to the description above with reference to FIG. 3), the mode signal MD may be same with a first control signal CTR1. Also, the monitoring circuit 144 may generate the output signal OUT and provide the output signal OUT to a system controller 148. The test circuit 146 may receive the output signal OUT from the monitoring circuit 144, generate a verify signal VFY, and provide the verify signal VFY to the system controller 148.

The system controller 148 may recognize the state of the voltage generator 142 and the state of the monitoring circuit 144 based on the output signal OUT and the verify signal VFY. The system controller 148 may output a signal indicating the state of the electrical system 140 to the outside of the electrical system 140, based on the output signal OUT and the verify signal VFY, and may control at least one of the voltage generator 142, the monitoring circuit 144, and the test circuit 146. For example, when the voltage generator 142 and/or the monitoring circuit 144 does not operate normally, the system controller 148 may stop the operation of the voltage generator 142. Also, the system controller 148 may instruct the test circuit 146 to test the monitoring circuit 144.

Referring to FIG. 15, as power is supplied to the electrical system 140 or a system including the electrical system 140, the input voltage $V_{IN}$ may reach a satisfactory level at time t51. The system controller 148 may instruct the test circuit 146 to test the monitoring circuit 144, and the voltage generator 142 may not start generating the output voltage $V_{OUT}$. The test circuit 146 may set the monitoring circuit 144 to a test mode by enabling the mode signal MD and generate an increasing ramp voltage $V_{RMP}$. Between time t51 and time t52, the ramp voltage $V_{RMP}$ may pass through a desirable range R0 of the output voltage $V_{OUT}$. Therefore, first and second output signals OUT1 and OUT2 may transition. At time t52, the test circuit 146 may determine whether the monitoring circuit 144 operates normally, based on changes in the first and second output signals OUT1 and OUT2, and may inactivate the mode signal MD. As the test circuit 146 determines that the monitoring circuit 144 operates normally, the test circuit 146 may generate the inactivated verify signal VFY.

At time t53, even though the input voltage $V_{IN}$ maintains a constant level, the voltage generator 152 may stop generating the output voltage $V_{OUT}$. For example, the system controller 158 may enter a low power mode. In this case, the system controller 158 may turn off the voltage generator 142. Therefore, the output voltage $V_{OUT}$ may decrease from time t53. At time t54, the system controller 158 may instruct the test circuit 146 to test the monitoring circuit 144, for example, before turning on the voltage generator 142 so as to release the low power mode. The test circuit 146 may set the monitoring circuit 144 to the test mode through the mode signal MD and may generate the increasing ramp voltage $V_{RMP}$ p.

Between time t54 and time t55, the ramp voltage $V_{MP}$ may pass through the desirable range R0 of the output voltage $V_{OUT}$. Therefore, the first and second output signals OUT1 and OUT2 may transition. As illustrated in FIG. 15, unlike between time t51 and time t52, a second period PER2' measured between time t54 and time t55 may be short. Therefore, the test circuit 146 may determine that there is an error in the operation of the monitoring circuit 14 based on the upper limit. Therefore, at time t55, the test circuit 146 may generate the inactivated verify signal VFY and inactivate the mode signal MD.

Between time t56 and time t57, the test circuit 146 may test the monitoring circuit 144. At time t57, when the test circuit 146 determines that the monitoring circuit 144 operates normally, the test circuit 146 may generate the activated verify signal VFY. At time t58, the output voltage $V_{OUT}$ may deviate from the range R0 due to an unspecified cause. Therefore, the monitoring circuit 144 may notify the system controller 148 of the abnormal operation of the voltage generator 142 by disabling the second output signal OUT2.

Figure 16:
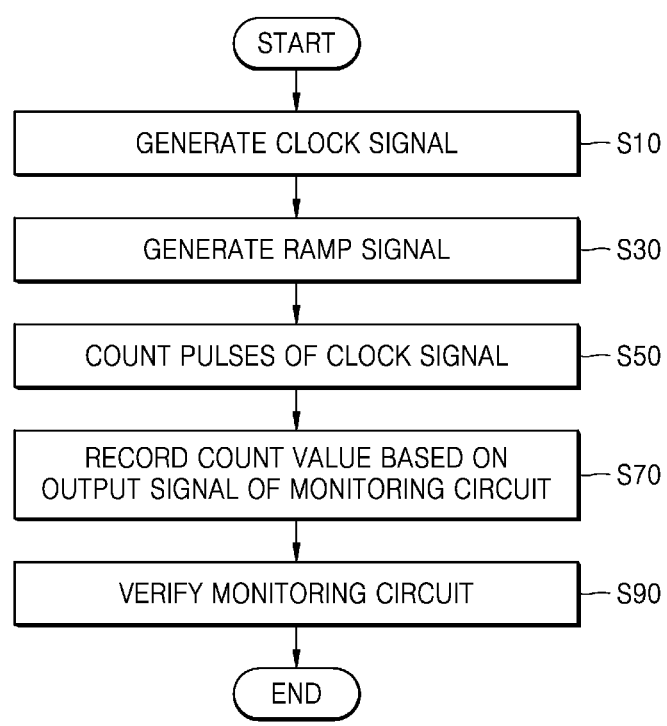
FIGS. 16, 17A, 17B, 18A, 18B and 19 are respective flowcharts variously summarizing examples of methods of testing a monitoring circuit according to an embodiment of the inventive concept.

FIG. 16 is a flowchart summarizing a method of testing a monitoring circuit according to an embodiment of the inventive concept. In some embodiments, the method of FIG. 16 may be performed using the test circuit 30 of FIG. 3.

Referring to FIGS. 2, 3 and 16, the clock signal may be generated (S10). For example, the test circuit 30 may include the clock generator (e.g., 109 of FIG. 10). The clock generator may generate the clock signal and provide the clock signal to the counter 35. The ramp signal RMP may be generated (S30). For example, the ramp generator 31 may generate the ramp voltage $V_{RMP}$ as the ramp signal RMP in response to the activated first control signal CTR1. Pulses of the clock signal may be counted (S50). For example, the counter 35 may count the pulses of the clock signal in response to the activated first control signal CTR1 and output the count signal CNT. The count value may be recorded based on the output signal OUT of the monitoring circuit 20 (S70). For example, the register set 37 may receive the output signal OUT, and the first and second registers REG1 and REG2 may store the value of the count signal CNT according to changes in the output signal OUT corresponding to the lower limit and upper limit. The operation of the monitoring circuit 20 may be verified (S90). For example, the controller 33 may end the test period by disabling the first control signal CTR1 and may determine whether the monitoring circuit (e.g., 20 of FIG. 2) operates normally, based on the duration of the test period and the ratios between the values stored in the register set 37. The controller 33 may generate the verify signal VFY corresponding to a result of the determining.

Figure 17A:
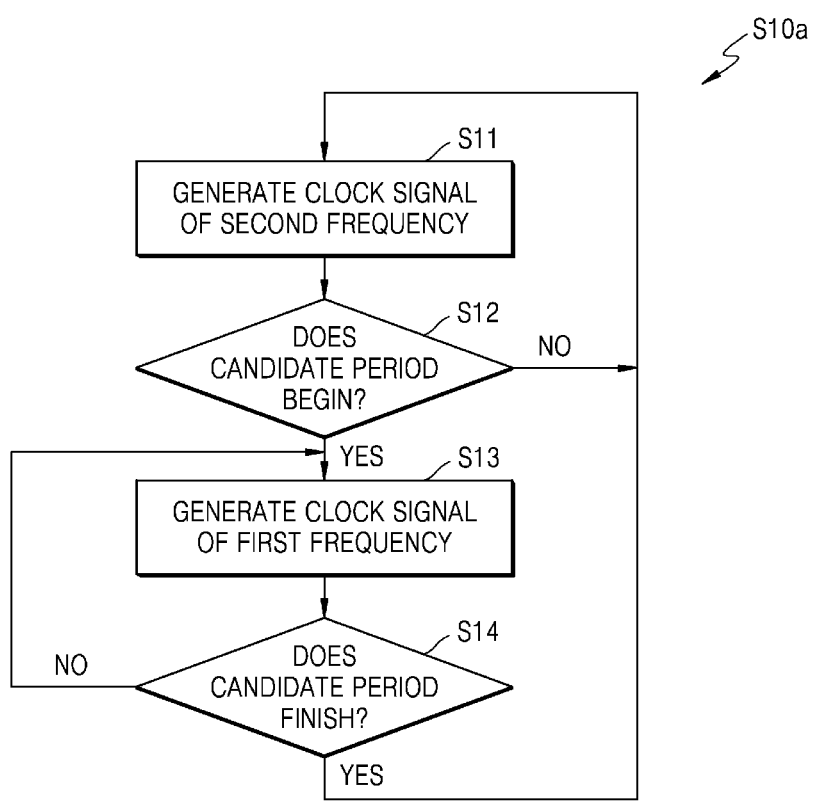
Figure 17B:
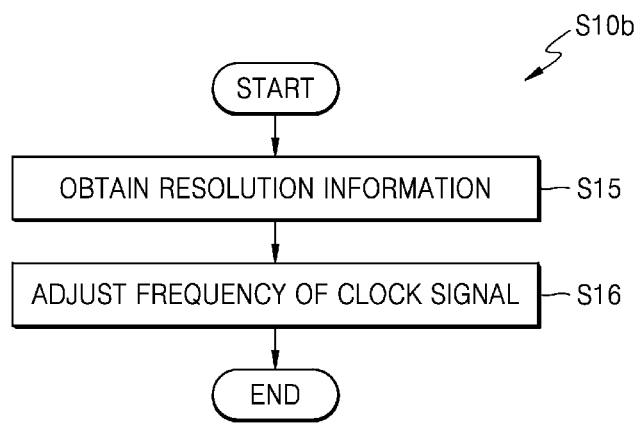

FIGS. 17A and 17B are flowcharts further summarizing examples of operation S10 of the method of FIG. 16 according to embodiments of the inventive concept. As described above with reference to FIG. 16, in operations S10a and S10b of FIGS. 17A and 17B, the clock signal CLK may be generated. In some embodiments, operations S10a and S10b of FIGS. 17A and 17B may be performed by the test circuit 100 of FIG. 10. FIGS. 17A and 17B will be described below with reference to FIG. 10.

Referring to FIG. 17A, operation S10a may include a plurality of operations S11 to S14. A clock signal CLK having a second frequency may be generated (S11). For example, the controller 103 may set the frequency of the clock signal CLK to the relatively low second frequency through the third control signal CTR3. A determination is made as to whether the candidate period has begun (S12). For example, the controller 103 may determine whether the candidate period begins, based on the count signal CNT. As illustrated in FIG. 17A, when the candidate period does not begins, operation S11 may be repeated. When the candidate period begins, the clock signal CLK of a first frequency may be generated (S13). For example, the controller 103 may set the frequency of the clock signal CLK to the first frequency higher than the second frequency through the third control signal CTR3 in the candidate period. A determination is made as to whether the candidate period is finished (S14). For example, the controller 103 may determine whether the candidate period finishes, based on the count signal CNT. As illustrated in FIG. 17A, when the candidate period does not finish, operation S13 may be repeated. When the candidate period finishes, the frequency of the clock signal CLK may be set again to the second frequency in operation S11.

Referring to FIG. 17B, operation S10b may include operations S15 and S16. Initially, resolution information may be obtained (S15). For example, the controller 103 may receive a signal including resolution information required for testing the monitoring circuit (e.g., 20 of FIG. 2) from an external and/or internal component (e.g., 148 of FIG. 14). The frequency of the clock signal CLK may then be adjusted (S16). For example, when the resolution information obtained in operation S15 corresponds to high resolution, the controller 103 may increase the frequency of the clock signal CLK, and when the resolution information obtained in operation S15 corresponds to low resolution, the controller 103 may decrease the frequency of the clock signal CLK.

Figure 18A:
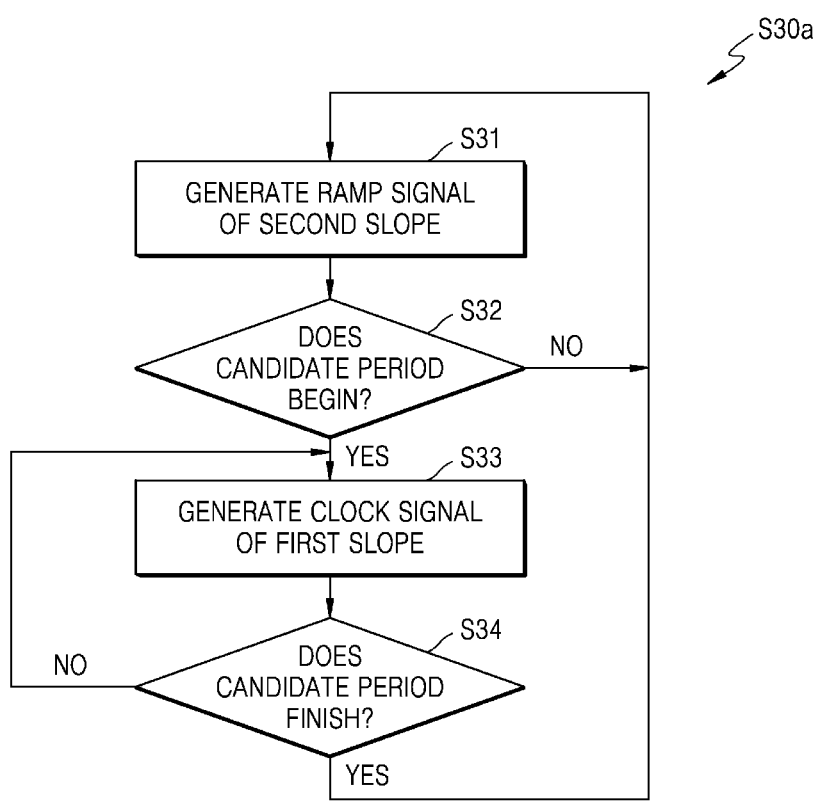
Figure 18B:
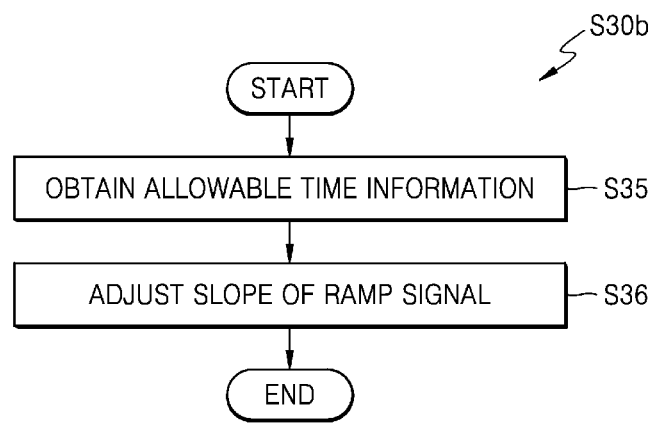

FIGS. 18A and 18B are flowcharts further summarizing examples of operation S30 of FIG. 16 according to embodiments of the inventive concept. As described above with reference to FIG. 16, in operations S30a and S30b of FIGS. 18A and 18B, the ramp signal may be generated. In some embodiments, operations S30a and S30b of FIGS. 18A and 18B may be performed by the test circuit 70 of FIG. 7. FIGS. 18A and 18B will be described below with reference to FIG. 7.

Referring to FIG. 18A, operation S30a may include generating the ramp signal of (or having) a second slope (S31). For example, the controller 73 may set the slope of the ramp voltage $V_{RMP}$ to the relatively high second slope using the second control signal CTR2. Next, a determination is made as to whether a candidate period has begun (S32). For example, the controller 73 may determine whether the candidate period begins based on the count signal CNT. As illustrated in FIG. 18A, if the candidate period does not begin (S32=NO), then operation S31 may be repeated. However, when the candidate period begins (S32=YES), the ramp signal of a first slope is generated (S33). For example, the controller 73 may set the slope of the ramp voltage $V_{RMP}$ to the first slope lower than the second slope using the second control signal CTR2 during the candidate period. Next, a determination is made as to whether the candidate period is finished (S34). For example, the controller 73 may determine whether the candidate period is finished based on the count signal CNT. As illustrated in FIG. 18A, if the candidate period is not finished (S34=NO), operation S33 may be repeated. However, when the candidate period is finished (S34=YES, the slope of the ramp signal may again be set to the second slope (S31).

Referring to FIG. 18B, operation S30b may include; obtaining allowable time information (S35); and adjusting the slope of the ramp signal (S36). For example, the controller 73 may receive a signal indicating allowable time information for testing by the monitoring circuit (e.g., 20 of FIG. 2) from an external or internal component (e.g., 148 of FIG. 14). Thereafter, the controller 73 may decrease the slope of the ramp signal when the allowable time information indicates a long time, or increase the slope of the ramp signal when the allowable time information indicates a short time.

Figure 19:
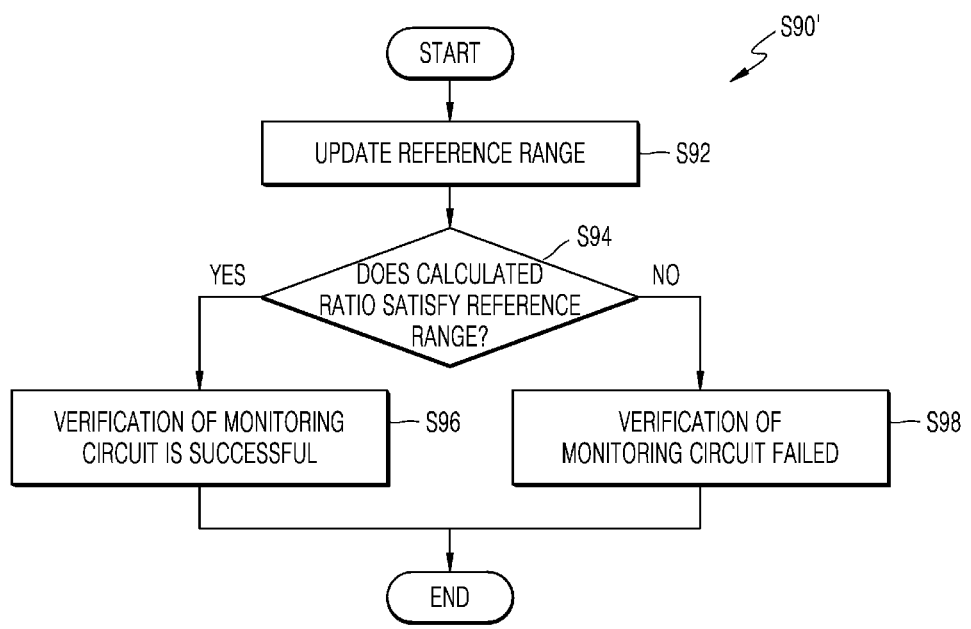

FIG. 19 is a flowchart further illustrating an example of operation S90 of FIG. 16 according to an embodiment of the inventive concept. As described above with reference to FIG. 16, the operation of the monitoring circuit may be verified in operation S90' of FIG. 19. In some embodiments, operation S90' may be performed by the test circuit 30 of FIG. 3.

Referring to FIGS. 1, 3, 5 and 19, a reference range may be updated (S92). The reference range may include the lower limit range R1 and/or the upper limit range R2 for the object signal OBJ. The controller 33 may modify one of the these ranges based on a signal received from an external source. A determination is made as to whether a calculated ratio satisfies the reference range (S94). For example, the controller 33 may calculate the ratio between the values stored in the register set 37 with respect to the entire test period and may determine whether the calculated ratio satisfies the reference range or a range obtained by modifying the reference range (e.g., ranges defined by [Equation 1], [Equation 2], and [Equation 3]). In some embodiments, the controller 33 may calculate a plurality of ratios and may determine whether the plurality of ratios respectively satisfy a plurality of reference ranges. When the calculated ratio satisfies the reference range (S94=YES), the verification of the monitoring circuit (e.g., 20 of FIG. 2) is deemed successful (S96) and a corresponding (e.g., activated) verify signal VFY is generated. However, if the calculated ratio does not satisfy the reference range (S94=NO), the verification of the monitoring circuit (e.g., 20 of FIG. 2) is deemed a failure and a corresponding (e.g., inactivated) verify signal VFY is generated (S98).

While the inventive concept has been particularly shown and described with reference to embodiments thereof, it will be understood that various changes in form and details may be made therein without departing from the spirit and scope of the following claims.

What is claimed is:

1. A test circuit for testing a monitoring circuit, the test circuit comprising:
   a ramp generator configured to generate a ramp signal in response to activation of a first control signal;
   a counter configured to count pulses of a clock signal in response to the activation of the first control signal;
   at least one register configured to store an output value of the counter based on a change in an output signal generated by the monitoring circuit in response to the ramp signal; and
   a controller configured to generate the first control signal, wherein the first control signal is configured to cause the monitoring circuit to be set to a test mode in response to the activation of the first control signal, and
   wherein the controller is further configured to verify operation of the monitoring circuit based on a ratio of at least one value stored in the at least one register, wherein the at least one value is obtained while the monitoring circuit is set to the test mode.

2. The test circuit of claim 1, wherein the ramp generator comprises a capacitor and a current source and is configured to generate the ramp signal by charging or discharging the capacitor with a current generated by the current source.

3. The test circuit of claim 1, further comprising:
   a reference register configured to store the output value of the counter at a time at which the first control signal is deactivated, and
   wherein the controller is further configured to verify operation of the monitoring circuit based on the ratio of a value stored in the reference register and the at least one value stored in the at least one register.

4. The test circuit of claim 1, wherein the controller is configured to deactivate the activated first control signal based on the output value of the counter exceeding a reference value.

5. The test circuit of claim 4, wherein the controller is configured to verify operation of the monitoring circuit based on a ratio of the reference value to the at least one value stored in the at least one register.

6. The test circuit of claim 1, wherein the controller is further configured to generate a second control signal, and
   wherein the ramp generator is configured to adjust a slope of the ramp signal based on the second control signal.

7. The test circuit of claim 6, wherein the controller is further configured to generate the second control signal so as to cause a decrease in the slope of the ramp signal during a candidate period that includes a time at which the change in the output signal is expected.

8. The test circuit of claim 6, wherein the controller is further configured to obtain allowable time information for testing of the monitoring circuit, and generate the second control signal based on the allowable time information.

9. The test circuit of claim 1, wherein the controller is further configured to generate a third control signal, and
   wherein the test circuit further comprises a clock generator configured to generate the clock signal with a frequency that is based on the third control signal.

10. The test circuit of claim 9, wherein the controller is further configured to generate the third control signal so as to cause an increase in the frequency of the clock signal during a candidate period that includes a time at which the change in the output signal is expected.

11. The test circuit of claim 9, wherein the controller is further configured to obtain resolution information for testing of the monitoring circuit, and generate the third control signal based on the resolution information.

12. The test circuit of claim 1, wherein the controller is further configured to determine that operation of the monitoring circuit is successful when the ratio falls within a reference range.

13. The test circuit of claim 12, wherein the controller is further configured to update the reference range.

14. The test circuit of claim 1, wherein the change in the output signal occurs when the ramp signal crosses a lower limit or an upper limit, and
   wherein the ramp generator is configured to generate the ramp signal so as to cross both the lower limit and the upper limit during a period in which the first control signal is activated.

15. The test circuit of claim 14, wherein the at least one register comprises:
   a first register configured to store a first value output by the counter when a change in the output signal occurs in relation to the lower limit; and
   a second register configured to store a second value output by the counter when a change in the output signal occurs in relation to the upper limit, and
   wherein the controller is further configured to determine that operation of the monitoring circuit is successful when a first ratio corresponding to the first value stored in the first register falls within a first reference range, and a second ratio corresponding to the second value stored in the second register falls within a second reference range.

16. The test circuit of claim 14, wherein the change in the output signal occurs when the ramp signal crosses a short circuit level lower than the lower limit, and wherein the ramp generator is configured to generate the ramp signal so as to cross the short circuit level during a period in which the first control signal is activated.

17. The test circuit of claim 16, wherein the at least one register comprises a third register configured to store a third value output by the counter when the change in the output signal occurs, and
wherein the controller is configured to determine that operation of the monitoring circuit is a failure when a third ratio corresponding to the third value stored in the third register does not fall within a third reference range.

18. A system comprising:
a main circuit configured to perform at least one function and generate an object signal;
a monitoring circuit configured to monitor the object signal during a normal mode and monitor a ramp signal during a test mode; and
a test circuit configured as a built-in, self-test for the monitoring circuit, and further configured to generate the ramp signal and test the monitoring circuit based on a ratio between a first period during which the ramp signal is generated, and a second period determined by a change in an output signal of the monitoring circuit in response to the ramp signal.

19. The system of claim 18, wherein the monitoring circuit is set to the test mode before the main circuit begins performing of the function, and is set to the normal mode after successful testing is performed by the test circuit.

20. A method of testing a monitoring circuit, the method comprising:
while the monitoring circuit is set to a first mode, monitoring, using the monitoring circuit, an object signal generated by a main circuit;
setting the monitoring circuit to a second mode; and
while the monitoring circuit is set to the second mode
generating a ramp signal,
providing the ramp signal to the monitoring circuit,
counting pulses of a clock signal while the ramp signal is generated,
storing a first count value based on a first period determined by a change in an output signal of the monitoring circuit, and
verifying operation of the monitoring circuit based on a ratio of the first count value and a second count value based on a second period corresponding to generation of the ramp signal.

* * * * *